(12) United States Patent
Kinder

(10) Patent No.: US 6,294,025 B1
(45) Date of Patent: *Sep. 25, 2001

(54) DEVICE FOR PRODUCING OXIDIC THIN FILMS

(75) Inventor: Helmut Kinder, Freising (DE)

(73) Assignee: Theva Dünnschichttechnik GmbH, Eching (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/091,982
(22) PCT Filed: Nov. 1, 1996
(86) PCT No.: PCT/DE96/02096
§ 371 Date: Dec. 7, 1998
§ 102(e) Date: Dec. 7, 1998
(87) PCT Pub. No.: WO98/20521
PCT Pub. Date: May 14, 1998

(51) Int. Cl.$^7$ ...................................... B05B 5/00
(52) U.S. Cl. .................. 118/641; 118/715; 118/728; 118/729; 118/730
(58) Field of Search .............................. 118/719, 723 DC, 118/725, 52, 724, 728, 715, 723 E; 427/577, 255.3, 248.1, 255.28, 255.32, 392; 438/785, 280.1, 267, 624, 655, 706; 204/192.11; 34/58; 117/200, 85, 82; 428/408, 450; 430/280.1, 267, 624, 655, 706; 522/162, 35

(56) References Cited

U.S. PATENT DOCUMENTS

| | | |
|---|---|---|
| 4,420,385 | 12/1983 | Hartsough . |
| 5,155,336 * | 10/1992 | Gronot et al. ...................... 219/411 |
| 5,204,145 * | 4/1993 | Gasworth .............................. 427/577 |
| 5,266,146 * | 11/1993 | Ohno et al. ........................... 156/345 |
| 5,382,293 * | 1/1995 | Kawarada et al. ............. 118/723 DC |
| 5,482,602 * | 1/1996 | Cooper et al. ................... 204/192.11 |
| 5,503,875 * | 4/1996 | Imai et al. ......................... 427/255.3 |
| 5,556,472 * | 9/1996 | Nakamura et al. ................... 118/719 |
| 5,679,404 * | 10/1997 | Pattern, Jr. et al. ............... 427/248.1 |
| 5,755,511 * | 5/1998 | Peuse et al. .......................... 374/128 |
| 5,781,693 * | 7/1998 | Ballance et al. ..................... 118/724 |
| 5,801,105 * | 9/1998 | Yano et al. ........................... 438/785 |
| 5,860,555 * | 10/1999 | Deaton et al. ............................ 34/58 |
| 5,868,850 * | 2/1999 | Ichishima et al. ................... 118/725 |
| 6,113,702 * | 9/2000 | Halpin et al. ........................ 118/725 |
| 6,123,766 * | 9/2000 | Williams et al. ....................... 117/85 |

FOREIGN PATENT DOCUMENTS

| | | |
|---|---|---|
| 4331885 | 3/1994 | (DE) . |
| 0 426 570 A2 | 5/1991 | (EP) . |
| 0 526 843 A1 | 2/1993 | (EP) . |
| 0 595 300 A1 | 5/1994 | (EP) . |

OTHER PUBLICATIONS

Rangelow et al, Reactive ion etching for microelectrical mechanical system fabrication, J. Vac. Sic. Technol. B 13(6), Nov. 1, 1996.*

* cited by examiner

Primary Examiner—Marian C. Knode
Assistant Examiner—Rudy Zervigon
(74) Attorney, Agent, or Firm—Crowell & Moring, LLP

(57) ABSTRACT

The invention relates to an apparatus for the production of thin oxide coatings, having a vacuum chamber wherein an oxygen chamber with an opening and a rotary substrate holder overlapping the latter are disposed. For the rotary arrangement of the substrate holder a rotary mounting is provided, which engages a circumferential portion of the substrate holder.

25 Claims, 10 Drawing Sheets

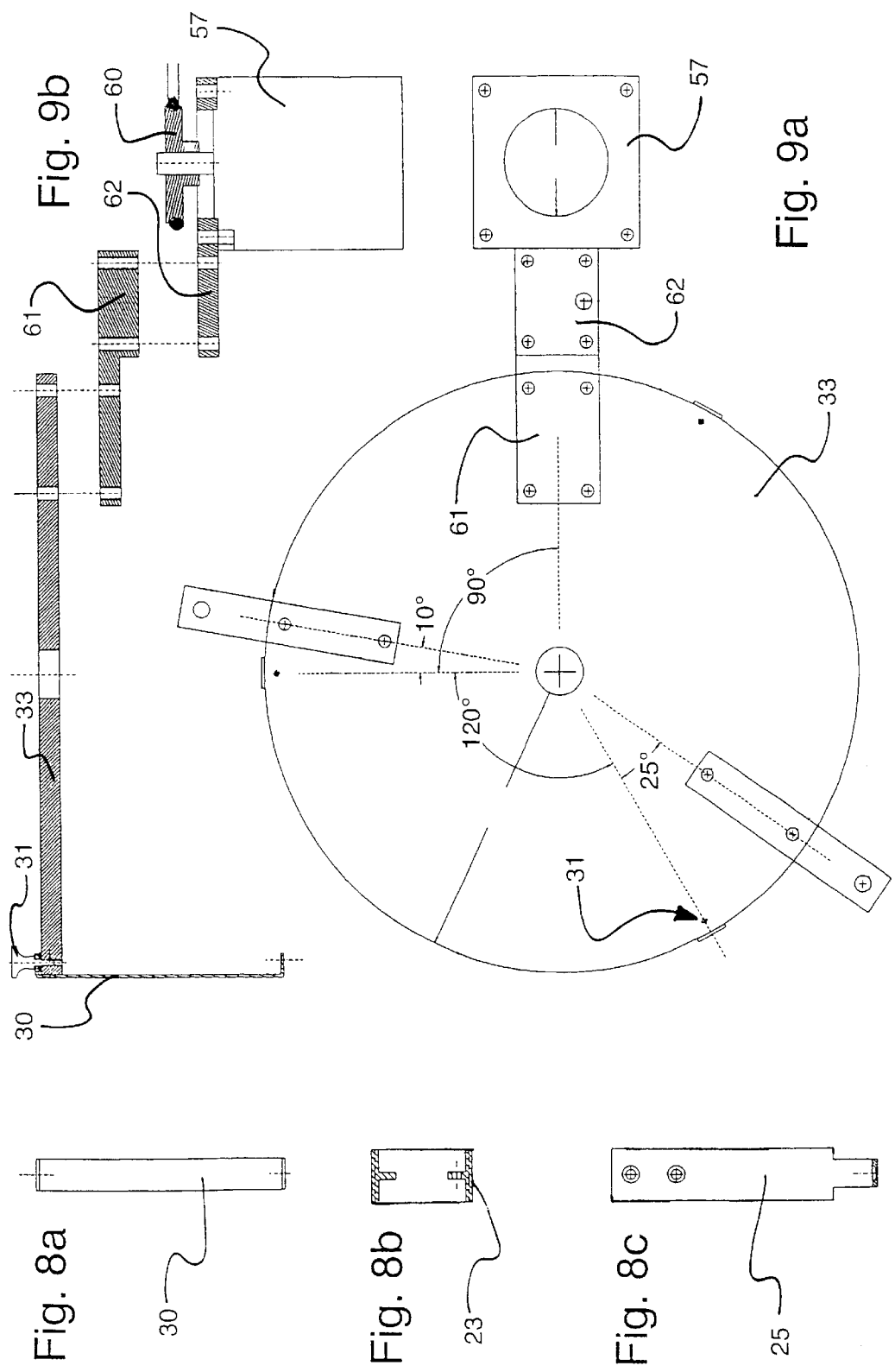

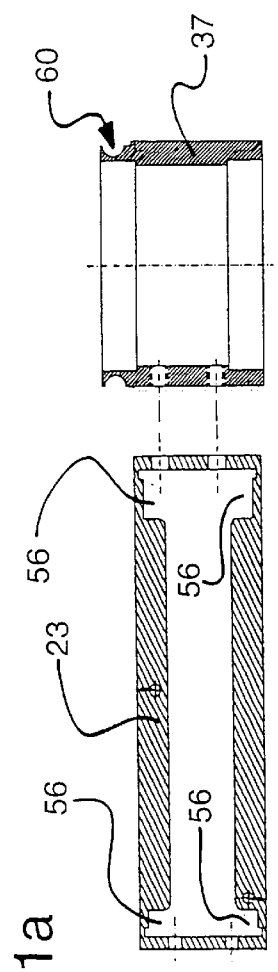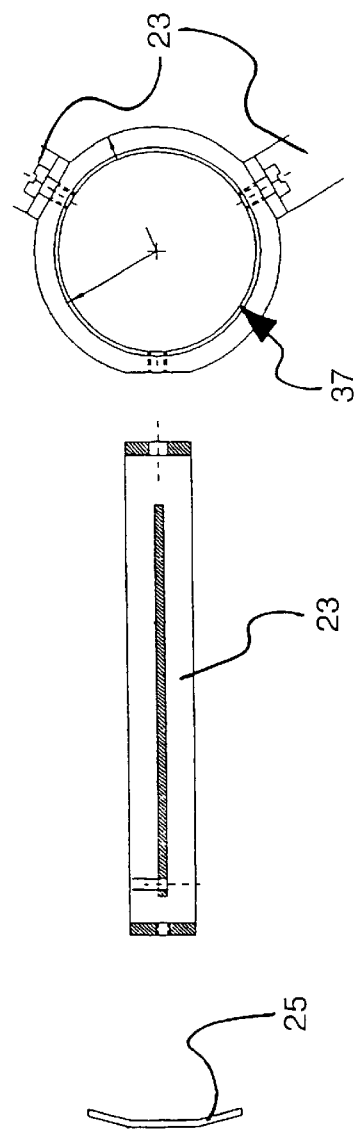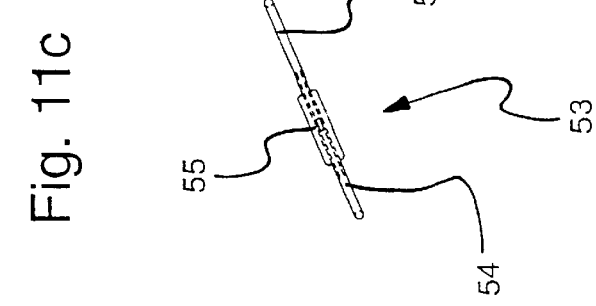
Fig. 11a
Fig. 11b
Fig. 11c

DEVICE FOR PRODUCING OXIDIC THIN FILMS

BACKGROUND AND SUMMARY OF THE INVENTION

This invention relates to an apparatus for producing thin oxide coatings including a vacuum chamber, an oxygen chamber with an opening and a rotary substrate holder.

Thin oxide coatings are modern working materials of electronics and electrical technology. They are chemical compounds of usually several metallic elements with oxygen. Depending on the composition, they may provide high-temperature superconductors, ferrous electricals, magnetoresistive coatings or ferromagnetic materials.

Examples of items which use thin coatings of high-temperature superconductors are magnetic field sensors (SQUIDs) with a corresponding transformer, antennas for nuclear resonance tomography and nuclear resonance analysis, filters and antennas in the microwave range for mobile radio and satellite communications, current limiters in energy technology, coated tapes as conductors for magnetic coils, and elements for the transmission of energy, and so on.

Ferroelectric thin oxide coatings are used, for example, for nonvolatile read-write memory (RAM) for the permanent tuning of microwave filters, for magnetoresistive coatings as read heads for computer hard disks, for ferromagnetic thin coatings generally for magnetic storage media, and for microwave components.

For most applications, large-area thin coatings are required. But components of large area can also be produced simultaneously in great numbers, so that an economic advantage results. An industrial production process must therefore be capable of coating large areas in uniform, repeatable quality.

For small and medium areas up to about 75 mm (about 3 inches) in diameter, there are a number of suitable methods and apparatus. The most important are cathode sputtering, laser ablation, chemical deposition from organometallic compounds (MOCVD), and co-evaporation of the metals in an oxygen atmosphere. Of the latter, the basic principle of thermal evaporation shall first be described in connection with the schematic drawing in FIG. 2.

In this case, the metallic elements are evaporated individually in a vacuum apparatus, while the rates of deposition are controlled so that the desired composition of the thin coating is achieved. Oxygen is fed to the thin layer growing on the substrate, simultaneously with the metal atoms, so that the oxide is formed. If the distance between the evaporation sources and the substrate is sufficient, the coating rate becomes homogeneous even on large areas. Sources are electron beam evaporators, Knudsen cells, and vapor depositing crucibles directly heated by the passage of electrical current through them.

Heated evaporation crucibles have the advantages that their evaporation rates can be stably controlled and that they are not sensitive to the oxygen always present in the apparatus. Also, the small dimensions of directly heated evaporation crucibles are a great advantage, since they permit arranging the sources especially close to one another. As a result, three metals, for example, are evaporated virtually from the same point. Then, the directional characteristic of the sources can lead to low gradients of the composition, the result being a sufficiently uniform quality of the coating, even over a large surface area.

Since the coating is performed as a rule at elevated temperature (300 to 800° C.), the substrate is in this case situated in a small, vertically positioned tubular furnace which permits indirect heating by thermal radiation. The oxygen is fed into this furnace. The oxygen pressure in the furnace is about 20 times higher than in the rest of the chamber, since the latter is constantly being pumped out. This permits sufficient oxidation of the substrate and nevertheless rectilinear propagation of the metal atoms without great scatter.

The basic version described here, however, is not suitable for large areas, since there is a limit to which the tubular furnace can be enlarged. If its diameter is increased, the flight distance of the metal atoms through the denser oxygen gas in front of the substrate also increases. Therefore the metal atoms undergo such great scattering that the rate of deposition becomes dependent upon pressure and can no longer be regulated with sufficient precision. In practice only areas up to $3 \times 3$ cm$^2$ are produced, and rejects for poor quality result.

Therefore, in practice, a rotating arrangement became known, in which the zone of deposition and the zone of oxidation are separated from one another. This turntable principle is sketched in FIG. 3. The substrate or substrates are disposed on a revolving table which again is heated by thermal radiation. The shaft of the turntable is brought out through a rotary lead-through and driven by a motor in the open air.

On the bottom of the turntable there is screwed a plate on which the substrates lie. The plate holds the substrates (wafers) only by the edge and leaves the rest of the wafer surface free so that they can be coated from underneath. Due to rotation at about 300 to 600 rpm, the wafer passes on, after being coated with about 1 atom thickness, into a pocket into which oxygen is fed. There, this atom layer is oxidized and the desired compound forms.

The oxygen pocket should be as ideally sealed as possible, so as to assure the greatest possible pressure difference with respect to the other parts. Since no sealing materials can be used on account of the high temperatures, and wear on a material gasket would greatly contaminate the growing coating, a controlled resistance to flow is used instead of a gasket, which is formed by the gap between the rotating plate and the margin of the stationary oxygen pocket.

The resistance to flow increases with the length of the gap and is inversely proportional to the square of its width. It is therefore especially important to make the gap as narrow as possible. There are limits imposed by mechanical considerations on the narrowness of the gap, which becomes more critical at greater diameters. Therefore, a turntable with central shaft permits the coating only of areas of up to 10 cm in diameter.

This limitation is therefore based on the fact that the central shaft is also greatly heated by thermal conductivity and is lengthened and distorted by thermal expansion. The result of elongation is that the gap narrows according to temperature. This can be compensated for, in principle, for a desired temperature by setting the gap too wide at room temperature. This procedure, however, is bothersome and is only marginally successful. One unavoidable difficulty, however, is that the shaft at the same time becomes distorted. As a result, the turntable is no longer precisely parallel to the oxygen pocket and begins to rub. The rubbing forms detritus which cakes together at high temperatures and deposits itself. The rubbing thus becomes rapidly more intense, until the turntable comes completely to a halt. The greater the diameter of the plate is, the smaller are the distortions of the shaft that will suffice to start this process. Therefore, turntables which are mounted on a central shaft are practical only up to about 10 cm diameter.

It is the purpose of the invention to create an apparatus for the production of thin oxide coatings in which the difficulties mentioned are avoided and vapor deposition surfaces of 20 cm and more are possible.

This purpose is accomplished with an apparatus for producing thin oxide coatings in which, for rotary arrangement of a substrate holder, a rotary mounting which engages a circumferential portion of the substrate holder is provided.

An apparatus according to the invention for the production of thin oxide coatings accordingly contains a vacuum chamber with an oxygen chamber with an opening, and a rotary substrate holder covering the opening. For the rotary arrangement of the substrate holder, a revolving mounting is provided which engages a circumferential area of the substrate holder. Thus the entire surface of the substrate holder is free to accommodate one substrate or several substrates and is not disturbed by the driven shaft. Furthermore, this type of circumferential mounting makes possible, in an advantageous manner, a quieter and more precise rotation of the substrate holder, especially in relation to the oxygen chamber. Another advantage of this configuration is that the effect of temperature on the rotary mounting and its drive can be minimized. The invention thus goes beyond the state of the art by improving the mechanism by appropriate measures.

According to a preferred embodiment of the invention, the rotary mounting permits the adjustment of the inclination of the substrate with respect to, and/or the distance of the substrate holder from, the opening of the oxygen chamber. Thus, the rotation of the substrate holder and the distance of the latter from the opening of the oxygen chamber can be optimized.

In another advantageous embodiment of the invention, the rotary mounting contains individual revolving arms spaced apart from one another, preferably three or more revolving arms, and dependent struts which engage the circumference of the substrate holder and connect the revolving arms to the substrate holder. The revolving arms can be rectangular or parallelogram-like. Also, the revolving arms can be connected by intermediate parts, e.g., washers or generally ceramic components of elevated resistance to thermal transfer, to the dependent struts. Thus, the thermal expansion of these components in the individual embodiment versions has the least effect on any distortion and collision of the substrate holder in operation. Moreover, the loading of the substrate holder is substantially facilitated by these embodiments.

The substrate holder can be made advantageously adjustable with respect to the oxygen chamber if at least one arm is, and preferably all revolving arms are, adjustable, especially for varying the distance of the substrate holder from the opening of the oxygen chamber, and if, for the adjustment of the at least one arm, an adjuster is provided for the preferably resilient deformation of the rectangular or parallelogram-like configuration of the arm. These embodiments combine a simple, good and differentiated adjustability of the substrate holder with minimum thermal conduction in the rotary mounting.

For example, an arm can be made in a rectangular configuration by milling a rectangular plate accordingly. Thus, a low thermal conductivity and sufficient stability are achieved simultaneously with low moving masses. The cross sections of the remaining areas in the form of the rectangular configuration can be kept as small as possible. Any adjustability of the revolving arms that might be present is facilitated by the fact that in the vicinity of the corners of the rectangular or generally parallelogram shape of the revolving arms there are score-like indentations which favor parallelogram deformation and at the same time advantageously impede thermal transfer.

A means for the adjustment of the substrate holder with respect to the oxygen chamber can contain bolts in each adjustable arm, which are at an angle to the latter. The two bolts are held together by an internally threaded sleeve. Each of the bolts has a different thread, such as a right-hand thread in one bolt and a left-hand thread in the other, or threads of different pitch or with different throw. The sleeve has corresponding internal threads, so that the adjustment of the sleeve will result in a contraction or extension of the system and thus, for example, elastic deformation of the arm in the form of a parallelogram. This leads to a lowering or raising of the dependent struts of the rotary mounting. Thus, the substrate holder can be set level with respect to a plane defined by a bearing of the rotary mounting and thus to the axis defined by the bearing of the rotary mounting. With this adjustment, it is furthermore possible to adjust the spacing or gap width between the substrate holder and the oxygen pocket in a simple and optimum manner.

In another advantageous embodiment, provision is made for the oxygen chamber to be positioned by means of preferably adjustable hangers which are at least largely parallel to the dependent struts of the rotary mounting and are located on a slightly larger circle, and for the dependent struts of the rotary mounting and the hangers of the oxygen chamber to contain the same material or consist of the same material and/or have the same or similar cross sections. Thus, a largely mutual compensation of the thermal expansion of the dependent struts and hangers and a minimum variation of the gap between the oxygen chamber or pocket and the substrate holder are provided.

Thus adjustments of the oxygen pocket or chamber with respect to the substrate holder can generally be made individually or in combination since the corresponding hangers are adjusted, for example, by means of their attaching screws. Advantageously, the screws attaching the hangers can be provided with spring washers or other resilient means. With this adjustability, the oxygen chamber can be set precisely level with respect to a plane determined by a bearing of the rotary mounting and thus to the axis determined by the bearing of the rotary mounting. Also, the gap between the oxygen chamber and the substrate holder can be adjusted.

To further reduce heat conduction through the dependent struts and the hangers the latter can have a minimal cross section. For example, these parts can be made of sheet metal strips which by their geometry have the additional advantage that, with the rotary mounting set accordingly, they can be situated very close to one another and thus be largely the same in their thermal elongation. In addition to the good maintenance of the distance set between the oxygen chamber and the substrate holder, this also results in good thermal insulation of the hot zone commonly present in an apparatus for the production of thin coatings. This brings the result, among other things, that a lower heating power is necessary, and the entire apparatus, which can also be called a vapor depositing apparatus, or individual units and components thereof, become less hot and give off less heat.

In another advantageous embodiment of the invention, the substrate holder contains a ring into which at least one carrier disk can be inserted which is designed for the accommodation and retention of at least one substrate. According to an embodiment of the invention, the substrate holder thus consists of a ring into whose circumferential area the rotary mounting is, or, more precisely, its dependent struts are, engaged, and of a disk laid into the ring, which in turn contains milled areas for holding substrates. In that case, the carrier disk can consist to special advantage of ceramic. With such an arrangement, even several substrates can be placed simultaneously and very simply into the substrate holders by operating the carrier disk together with all substrates lying on or in it. Thus, the automation of the loading of the substrate holder can be achieved.

In another advantageous embodiment of the invention the rotary mounting can pivot on a fixed shaft, the fixed shaft being furthermore cooled, and especially water-cooled. Also, the bearing of the rotary mounting of the substrate holder can be situated preferably near it. The result is good cooling of the bearing, which may be a ball bearing, for example, providing for the rotation of the rotary mounting, as well as improved stability of the structure. If a ball bearing is used, it can be formed of a plurality of individual ball bearings, which then can preferably be clamped against one another for further improvement of stability.

Additional protection of the bearing of the rotary mounting on the fixed shaft can achieved advantageously by arranging on the fixed shaft a heat shield between the bearing of the rotary mounting of the substrate holder and the substrate holder, by making the shield preferably integral with the fixed shaft, and/or by making the fixed shaft and the heat shield, if used, at least substantially of a material of good thermal conduction. These possibilities can be supplemented if the heat shield contains a cooling body connected to the cooling of the fixed shaft, and/or a plurality of lamellar or leaf-like radiation shields, the latter being located between the cooling body and the substrate holder. In this manner, a simple and effective additional heat shielding and in some cases cooling of the bearing of the rotary mounting against the substrate lying in the so-called "hot" zone of the system are provided. This has a positive effect on maintaining the distance between the oxygen chamber and the substrate holder and on the maintenance of an optimum running and uniform alignment of the rotary mounting. The radiation shields can be realized with especially little difficulty in the form of a stack of sheets. Another type of construction is thin plates or the like supported on one another by cleats.

To achieve the greatest possible uniformity of temperature on the entire surface to be coated, it is advantageous to provide a surface heater between the heat shield and the substrate holder. This can be achieved advantageously through the fixed shaft. For example, electrical conductors can be passed to the surface heater through bores in the shaft, next to a passage or passages carrying the cooling water, if provided.

Additionally, to achieve the greatest possible uniformity of temperature on the entire surface to be coated, a peripheral heater can be provided around the circumference of the substrate holder, and/or by heating the oxygen chamber, especially by means of a bottom-side heater on the side facing away from the substrate holder. The same purpose can furthermore be served by forming, in the area of the substrate holder outside of the oxygen chamber, a vapor depositing zone which is defined by a vapor depositing flue aimed at the substrate holder, and preferably providing a flue heater for heating the vapor depositing flue and/or by arranging a bottom heater for heating the substrate holder, on the side of the latter facing toward the vapor depositing flue, in the area outside of the vapor depositing flue. By combining the individual heaters, it can be brought about that they will enclose the entire substrate heater so as to approach cavity radiation. In this manner a uniform temperature is assured in an optimum manner on the entire deposited surface.

Like the shielding of the top-side heater by the heat shield against thermal radiation from the substrate holder, the peripheral heater and for the bottom heater can be heat-shielded on their sides facing away from the substrate holder and/or the flue heater can be shielded on its side facing away from the vapor depositing flue.

Another embodiment of the invention has to do with the construction of the heaters. Accordingly, the top-side heater, the peripheral heater, the bottom heater and/or the flue heater can contain jacket heater wires lying especially close together, which are attached to heating wire holders by mechanical binding means and, with special preference, without soldering. It is advantageous if all heat surfaces are covered as closely as possible with jacket heater wires. The result will be a large radiant heating surface. For a given or necessary radiation power, the result will thus be that the heaters will have the lowest possible temperature. This will result in a correspondingly low burn-off of impurities, which in turn results in better quality in the thin coatings. Moreover, the life of the heater wires is thereby extended. By fastening the jacket heating wires without hard soldering or the like, for example by binding with thin stainless steel wire, the vaporizing of impurities from the solder is advantageously prevented. Furthermore, less mechanical tension occurs as the heating elements heat up and cool down, which again lengthens the life of the heating wires. These aspects are also entitled to independent inventional significance.

In the vapor-depositing of substrates, no precisely uniform coating thickness is obtained, as a rule. The coating thickness is greatest directly opposite the evaporation sources and increases radially inward and outward during the rotation of the substrate. Particularly in the case of smaller deposit surfaces, this effect is of hardly any importance regarding the usefulness of the thin coatings. But the greater the surface to be coated is, whether it be a single large substrate or a number of smaller surfaces, the more this effect detracts from the quality of the coating. To counteract this, provision is made, from another aspect of the invention, to which independent importance is also to be attributed, for forming, in the area of the substrate holder outside of the oxygen chamber, a zone of deposit in the shape of a sector of a circle, and is defined preferably by a sector-shaped cutout mask which is recessed concavely within the vapor deposition zone, especially along the radial sides of the sector. In this manner, the time of action of the deposition is influenced on the basis of the rotation of the substrate over the radius of the substrate holder such that, directly above the vapor sources, a shorter deposition time is available than if the radial sides of the sector were linear. This has the consequence that the deposited coating thickness is more uniform.

Another variant configuration of the invention, also of inventional importance, consists of the fact that, to drive the rotary mounting, a motor is disposed within the vacuum chamber, which, especially in the area of the bearing of the rotary mounting, is dynamically coupled to the rotary mounting on the fixed shaft, and that preferably a metal transmission, containing for example a coil spring and belt pulleys, a chain with sprockets and/or a gear drive, is provided for the dynamic coupling of the motor and the rotary mounting. On the one hand, this avoids the short life of a lead-through of transmission means subject to wear, such as a vacuum lead-through, from a motor mounted outside of the vacuum chamber to the rotary mounting. On the other hand, this type of construction makes it possible to make the motor and its drive means as a single unit with the rotary mounting. Such a single unit is easily taken out, for service and adjustment purposes for example, so that this work is greatly facilitated.

The motor within the vacuum chamber, or generally within the vapor depositing apparatus, can be provided with a cooling jacket which, for example, is water-cooled. The construction of the transmission of metal parts, such as a coil spring and belt pulleys, a chain with sprockets and/or a gear drive, for example, avoids the danger of thermal decomposition of these parts. The use of parts made of other materials that are not fireproof or do not have this heat resistance would result in contamination due to their combustion and thus render the transmission inoperative.

An additional facilitation of service and adjustment operations can be brought about by disposing drawer slides in the vacuum chamber, on which individual components of the apparatus which are situated within the vacuum chamber can be drawn entirely or partially out of the vacuum chamber.

Preferably, some components, especially in heated zones of the apparatus, can be made entirely or partially of high grade steel, high temperature steel such as INCONEL, for example, and/or ceramic. Alternatively, or in addition, the rotary mounting and/or the substrate holder can be made wholly or partially of a material of low thermal conductivity and/or thermal expansion. A construction with some or all parts of ceramic will be more dimensionally accurate and thus will be able to be set at a closer gap between the oxygen chamber and the substrate holder and substrate. This leads to a lower flow of oxygen through the gap, so that a lower pump capacity is required and/or a larger substrate holder can be used, in order to be able to treat still larger substrates or a larger number of substrates simultaneously.

In another advantageous embodiment of the invention, also having independent inventional significance, at least one vapor deposition device, especially a vapor depositing crucible, lies outside of the oxygen chamber and is associated with the vapor deposition flue, if any, and is disposed on a circle whose radius amounts approximately, and preferably exactly, to one-half of the radius of the substrate holder or carrier disk, and whose center is aligned with the axis of the substrate holder. Preferably, a plurality of vapor deposition apparatus or crucibles are provided which are arranged closely together on the circle. Thus, the coating thickness becomes uniform and concentration gradients in thin coatings containing several metal components are avoided.

Furthermore, a plurality of vapor depositing devices, especially crucibles, can be provided, and an electron-beam gun that can move relative thereto can also be provided. In this embodiment, the electron-beam gun is preferably mounted in the vapor deposition apparatus such that it can be moved over the vapor deposition crucibles. In this manner, in-situ buffer coatings and cover coatings can be prepared, which is important in microwave filters, for example.

A preferred variable size of the distance between the substrate holder and the opening of the oxygen chamber, when the apparatus is running, amounts to 0.3 mm.

Additional preferred and advantageous embodiments of the invention are to be found in the dependent claims and combinations thereof. Moreover, features from the state of the art as set forth at the beginning of this description can be combined with the above embodiments and those described in the claims.

BRIEF DESCRIPTION OF THE DRAWINGS

The invention will now be described by way of example with the aid of embodiments shown in the drawings, wherein:

FIG. 8a is a side view of a hanger of the embodiment shown in FIG. 5 of the apparatus for producing thin oxide coatings.

FIG. 8b is a side view of a dependent strut of the embodiment shown in FIG. 5 of the apparatus for producing thin oxide coatings.

FIG. 8c is a cross section of a rotary arm of the embodiment shown in FIG. 5 of the apparatus for producing thin oxide coatings.

FIGS. 9a–9b are design drawings of a cover plate with mounting parts of the embodiment shown in FIG. 5 of the apparatus for producing thin oxide coatings in plan and in an exploded view showing details of the hangers.

FIG. 11a is a pulled-apart view of a section through the shaft, an arm and a dependent strut of the embodiment shown in FIG. 5 of the apparatus for producing thin oxide coatings.

FIG. 11b is a pulled-apart view of a plan of the shaft, an arm and an embodiment of a dependent strut of the embodiment shown in FIG. 5 of the apparatus for producing thin oxide coatings.

FIG. 11c is a drawing of an adjuster for the arm shown in FIGS. 11a and 11b.

DESCRIPTION OF THE PREFERRED EMBODIMENTS

In the individual representations and figures of the drawings, identical or similar parts, as well as parts that work the same or similarly, are always provided with the same reference number. Thus, and by the drawings themselves, individual features can be recognized by the man of the art, even if they are not described in detail or not in every one of the figures.

Figure 2:
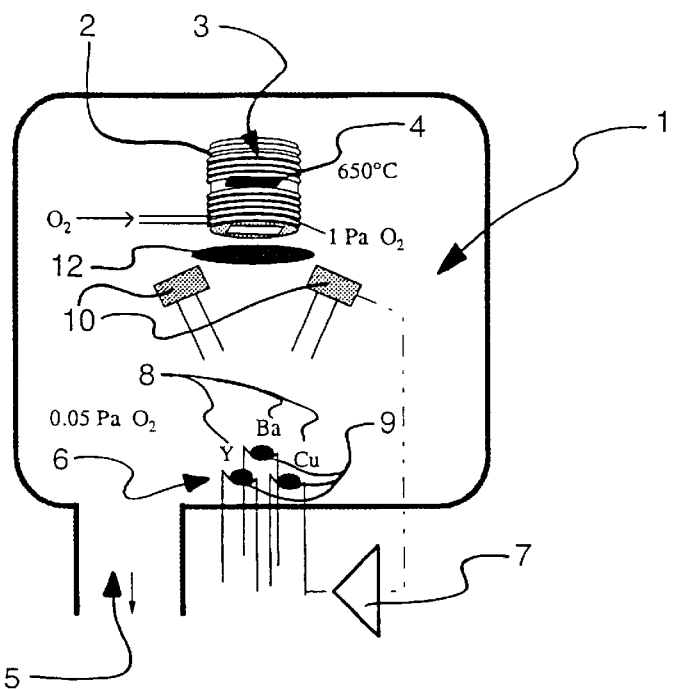
FIG. 2 is a sketch of a basic version for thermal reactive deposition from crucibles.

The apparatus for the production of thin oxide coatings contains a vacuum chamber 1, as can be seen from the general drawing in FIG. 2. In the upper part of the vacuum chamber 1, there is again shown an oven 3 for heating a substrate 4. In the bottom part of the vacuum chamber 1, which is connected by an aspirating exhaust 5 with a pump (not shown), there is an evaporator 6 with a vapor depositing control 7. The evaporator 6 contains, in the example illustrated, three vapor depositing devices 8 in the form of crucibles 9, each of which is designed for the evaporation of yttrium, barium and copper. The vapor depositing control 7 controls the operation of the vapor depositing devices 8 on the basis of rate meters 10 which are ideally present separately for each crucible 9, although only two of them are shown in this figure. So that each rate meter 10 detects, insofar as possible, only the evaporation rate of one vapor depositing crucible 9 and thus of one material, a collimator can be provided with each rate meter 10 indicated n FIG. 2.

Immediately underneath the oven 2, at least substantially surrounding the substrate 4, there is a closure 12 for the purpose of being able to begin and end the deposition of material evaporated from the crucibles 9 onto the substrate.

The above-described components are fundamentally present, along in some cases with the features and specifications given in the introduction, also in an apparatus for the production of thin oxide coatings according to the present invention.

As was already stated in the introduction of this description in connection with FIG. 2, in the state of the art, as is represented schematically in FIG. 2, for example during the evaporation process, oxygen is fed constantly to the evaporation surface of substrate 4 in order to form oxide permanently with the vapor-deposited metal. Alternatively, it was known to hold the substrate on a turntable 13 and by its rotation to expose it alternately to the metal vapor and to the oxygen in an oxygen chamber 14, as has been described in connection with FIG. 3.

Figure 1:
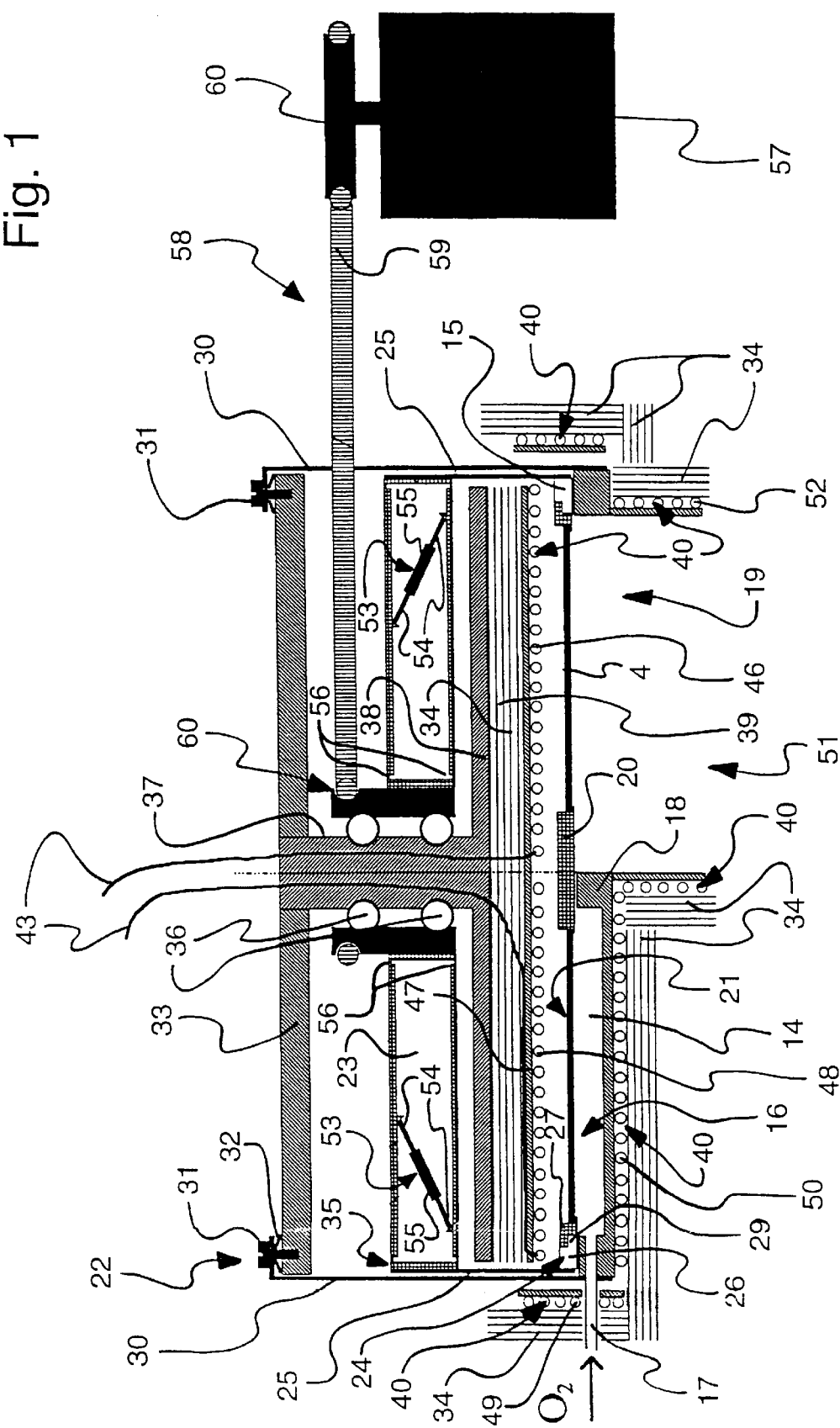
FIG. 1 is a schematic sectional view taken through a number of important components of an embodiment of the apparatus for the production of thin oxide coatings.
Figure 3:
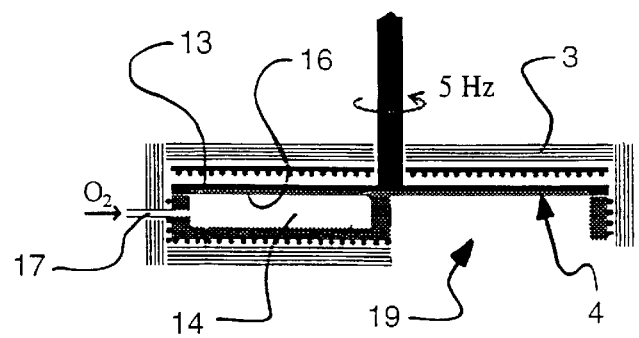
FIG. 3 shows a turntable system of an apparatus for producing thin oxide coatings according to the state of the art, with a central shaft.
Figure 12A:
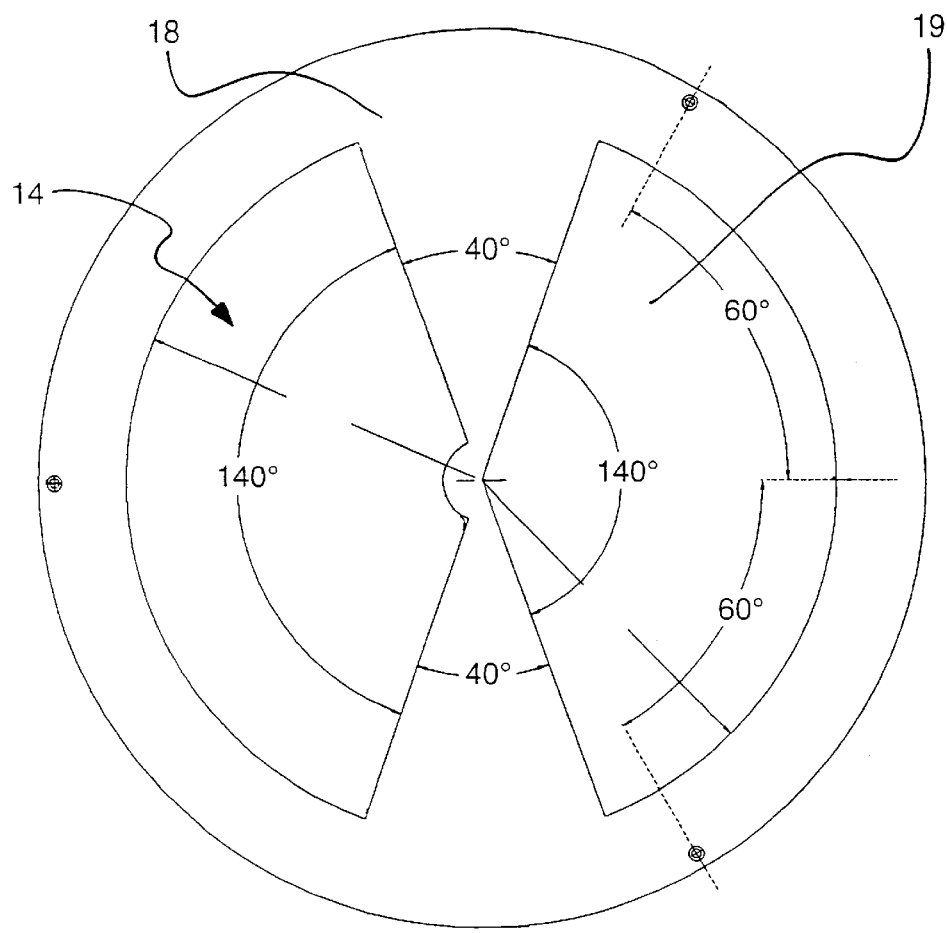
FIGS. 12a–12b is a plan view and a sectional view through a cover plate with an oxygen chamber and a vapor deposit zone sector-shaped cut-out of the embodiment shown in FIG. 5 of the apparatus for producing thin oxide coatings.

Based on the second principle, and with reference now to FIG. 1, the apparatus contains, for the production of oxide coatings according to the invention in addition to or instead of the components represented in FIGS. 2 and 3, a substrate holder 15, which is so disposed that it covers an opening 16 of an oxygen chamber with at least one oxygen feed 17. The substrate holder 15, which can also be called a turntable, is circular, and is situated above a likewise circular bottom plate 18 which is shown separately in FIGS. 12a and b.

Figure 12B:
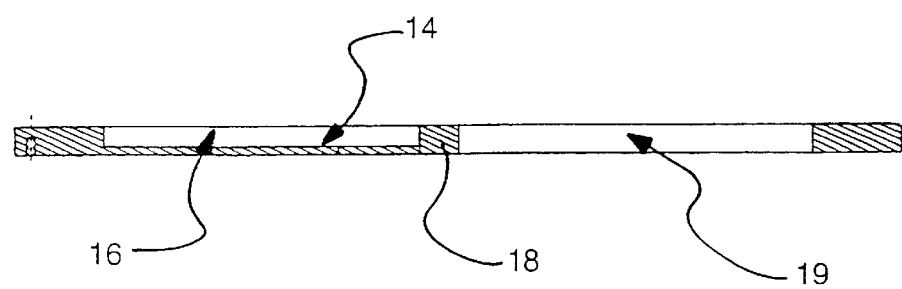

As can be seen especially in FIG. 12b, the oxygen chamber 14 is formed directly in the bottom plate 18 and has a sector-like shape, but does not reach all the way to the center point of the circle defined by the bottom plate 18. This also can be seen in FIG. 12b. The bottom plate 18 furthermore contains a sector-shaped opening which acts as a mask 19 with a sector-shaped cut-out. In contrast to the oxygen chamber, however, the mask does reach all the way to the center of the circle defined by the bottom plate 18. The oxygen chamber 14 and the mask 19 are symmetrically disposed in the circle defined by the bottom plate 18 and extend over, for example, 140°.

A variant of the mask 19 that is not separately represented is such that its center point lies on the axis of the substrate holder 15 and such that it is drawn concavely along the radial sides of the sector toward the inside of the vapor deposition zone. Due to the inward curvature of the radial sides of the segment 19, the time of action of the vapor deposition is so controlled that no greater coating thickness is produced in the area of the center of the radius of the mask 19, since here only a shorter time is available for deposition on the substrate so as to even out a higher metal vapor concentration of the metal atoms. By the precise shaping of the radial sides of the mask 19, the thickness deposited over the entire radius of the substrate holder, at least to the extent that it is free of the mask 19, is kept at least essentially constant. If desired, however, a specific thickness profile can be achieved by this means, requiring only that the shape of the mask 19 be designed accordingly.

Figure 14A:
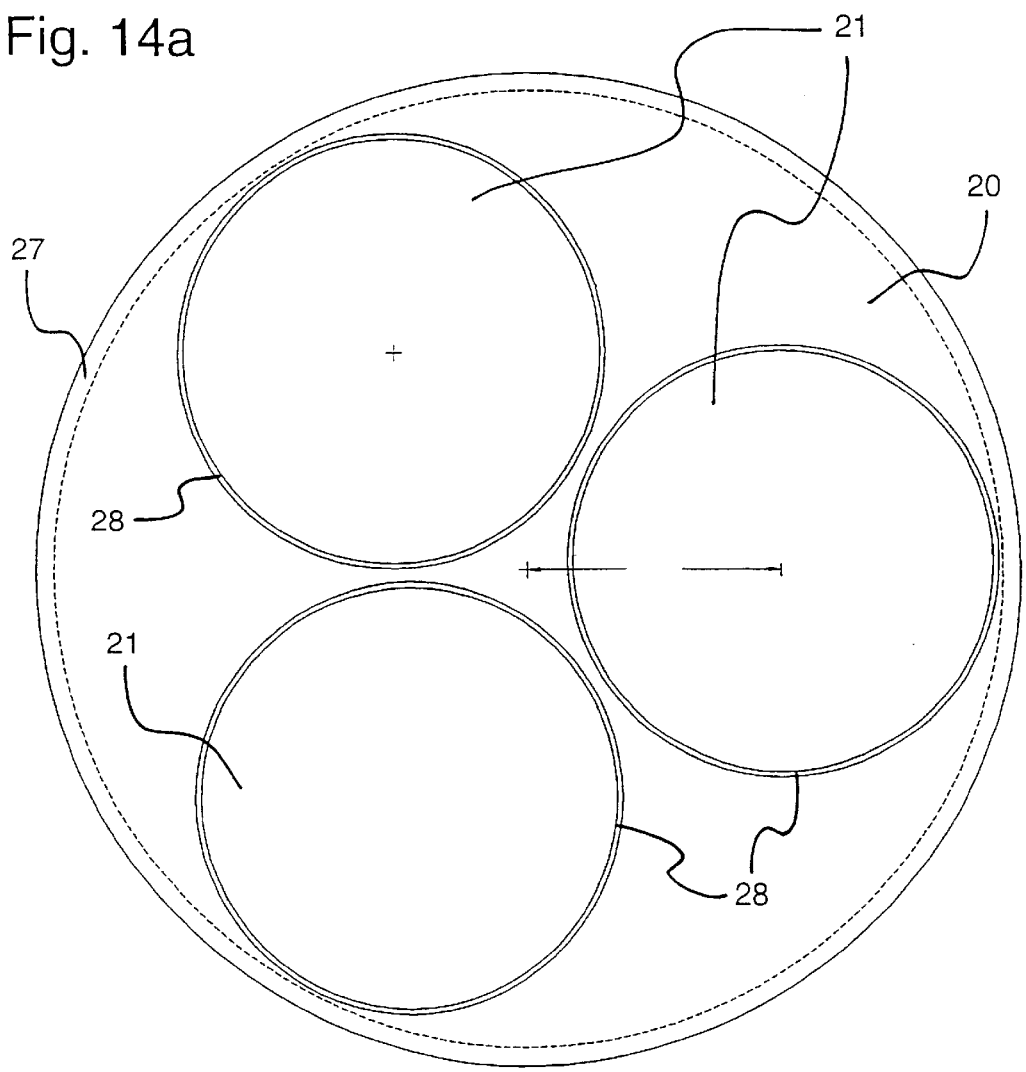
FIGS. 14a–14b is a plan view and a sectional view through an embodiment similar to FIG. 4a of a carrier plate which is also to be referred to as a turntable, for three 4" wafers of the embodiment shown in FIG. 5 of the apparatus for producing thin oxide coatings.
Figure 14B:
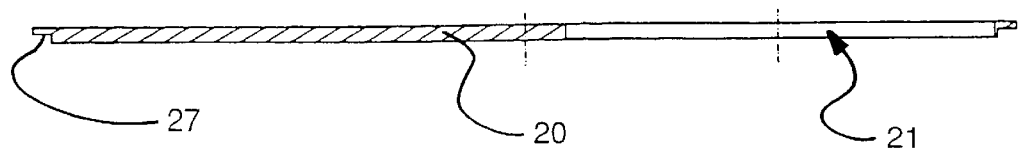
Figure 15A:
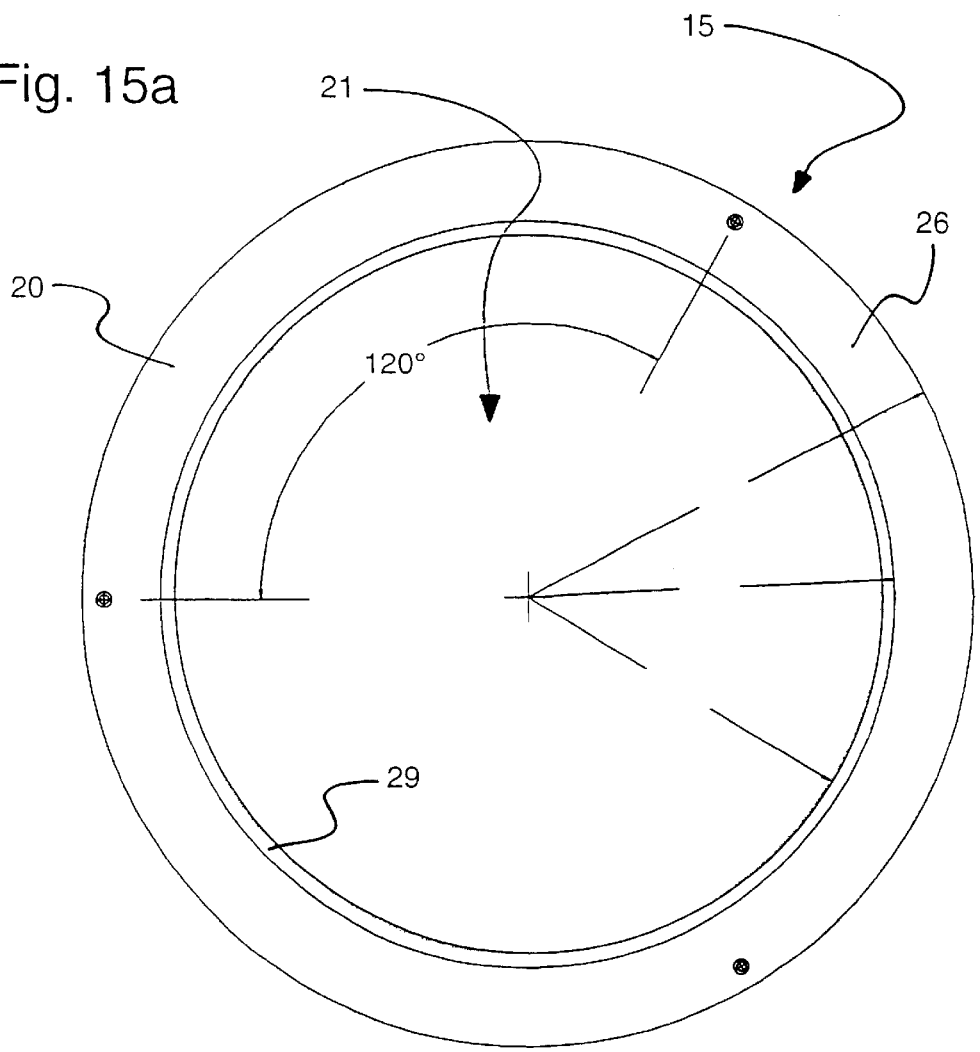
FIGS. 15a–15b is a plan view and a sectional view through an additional embodiment of a carrier plate for one wafer of the embodiment shown in FIG. 5 of the apparatus for producing thin oxide coatings.
Figure 15B:
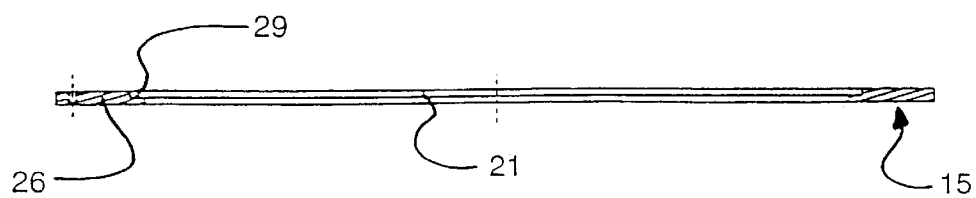

The oxygen chamber 14 and the mask 19 are also to be seen in FIG. 1, from which it also can be learned that the substrate holder 15 holds a carrier plate 20 in which substrates are laid, for example through appropriate recesses 21 (see e.g. FIGS. 14a and b and 15a and b). For the positioning and rotation of the substrate holder 15, a rotary mounting is provided, which is generally identified at 22 and contains essentially three revolving arms 23 and dependent struts 25 connecting them with the margin or generally the circumferential area 24 of the substrate holder 15. This means that the rotary mounting 22, in contrast to the state of the art shown in FIG. 3, engages the circumferential area 24 of the substrate holder 15. The rotary mounting 22 and its parts, and especially the dependent struts 25, consist at least essentially of a material of poor thermal conductivity, and minimal thermal expansion. Thus, the thermal expansion will have very little effect on the distortion and collision of the substrate holder 15 during its rotation. Moreover, the loading of the holder 15 with substrates 4 through the spaces or intervals between the dependent struts is greatly facilitated.

Figures 4A, 4B, 4C:
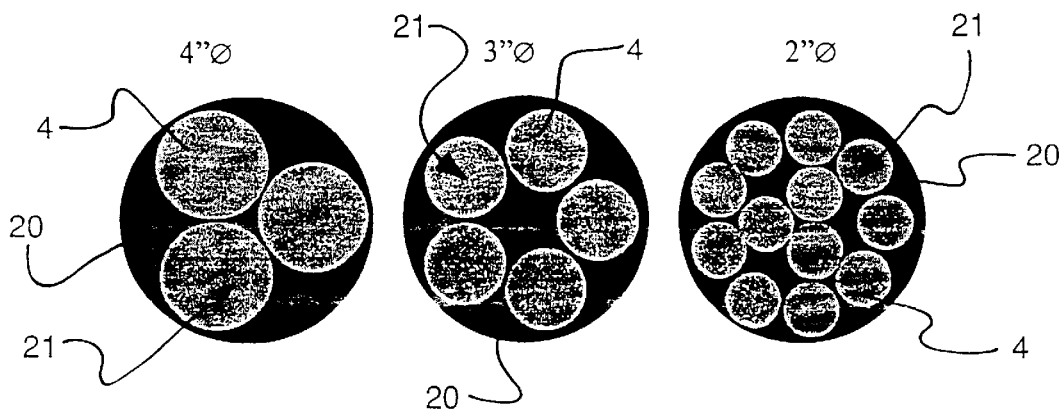
FIGS. 4a–4c are plan views of various embodiments of carrier disks bearing substrates.
Figure 5:
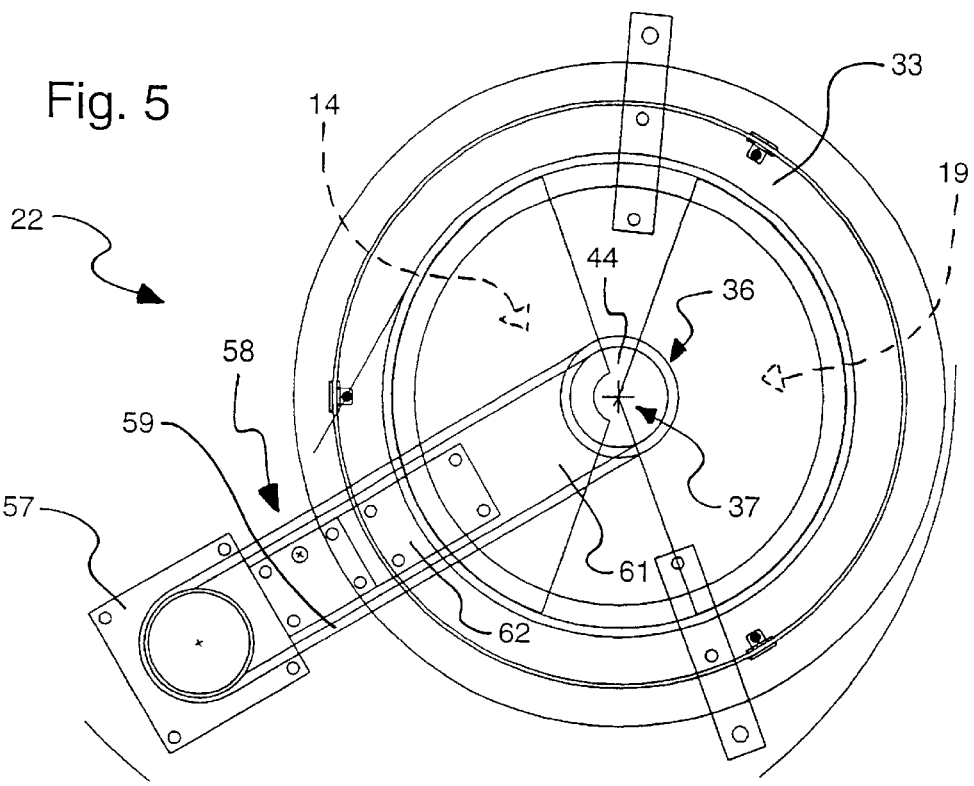
FIG. 5 is a design drawing in plan of the embodiment shown in FIG. 1 of the apparatus for producing thin coatings.
Figure 6:
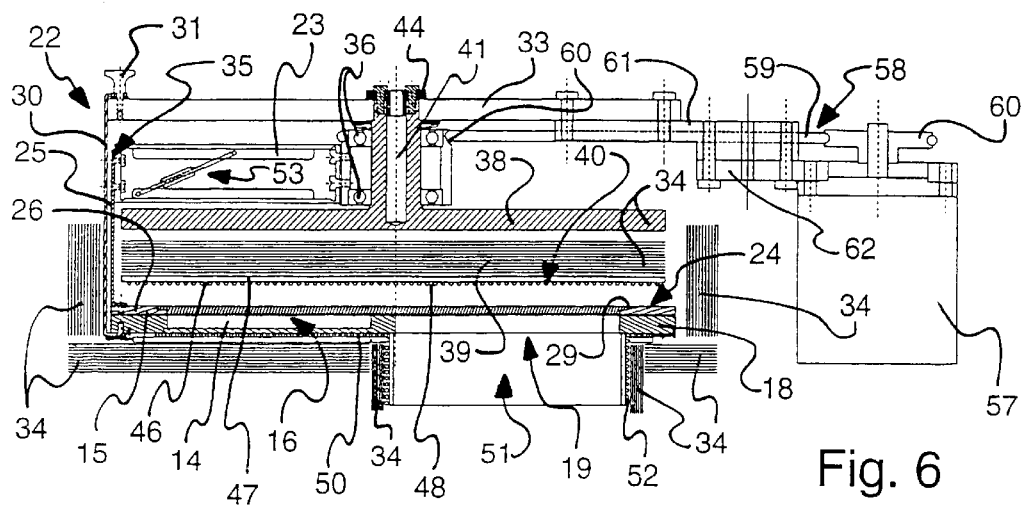
FIG. 6 is a design drawing of the apparatus shown in FIG. 5 of the apparatus for producing thin oxide coatings, in a sectional view along line VI—VI of FIG. 5.

The substrate holder 15 consists of a ring 26 with a carrier plate 20 laid in it, which in turn holds the substrates 4 in recesses 21 (see e.g. FIGS. 14a and b and 15a and b), as has already been stated above. Thus, all of the substrates 4 can be inserted or removed laterally, simultaneously and very easily. This also makes it possible to automate the loading of the substrates 4. Examples of possible configurations of the recesses 21 can be seen in FIGS. 14a and b, and 15a and b, and also in FIGS. 4a–c, substrates 4 laid in place also being represented in the latter figure. FIGS. 14a and b and 15a and b show furthermore that both the carrier plate 20 and the recesses 21 contain shoulders 27 and 28, respectively, the former at its outer margin and the latter at their inner margins. It is not absolutely necessary that the carrier plate have a shoulder-like formation at its outer margin.

Alternatively, or additionally, (also) the ring 26 of the substrate holder 15 can have at its inner circumferential margin a shoulder 29 (see FIG. 1), for example.

The suspension of the oxygen pocket or chamber 14 is done in the case of the embodiment shown in FIG. 1 in a manner similar to that of the substrate holder 15. Suspension may be performed, for example, by providing for the oxygen chamber 14 likewise three hangers 30 of the same material as the dependent struts 25, and disposing them as close together radially as possible. In this manner a far-reaching mutual compensation of the thermal expansion of the dependent struts 25 and the hangers 30, resulting in a minimal change in the width of the gap between the oxygen chamber 14 and the substrate holder 15. It is necessary to keep this gap as small as possible, since the oxygen-filled or swept oxygen chamber 14 must be sealed from the rest of the space in the vacuum chamber, which is assured only by the slot seal with the smallest possible space between the oxygen chamber 14 and its opening 16 and the substrate holder 15 with the carrier disk and, in any case, substrate 4.

Basically, other and different numbers of dependent struts and hanger struts 30 can also be provided, but the version here discussed with three dependent struts 25 and hanger struts 30 is especially advantageous and therefore is preferred.

Figure 7:
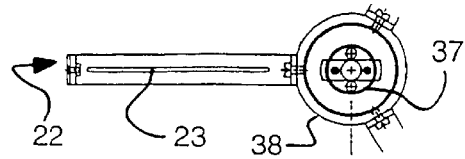
FIG. 7 is a partial schematic representation in a top view of the shaft and rotating revolving arms of the embodiment shown in FIG. 5 of the apparatus for producing thin oxide coatings.

The positioning of the oxygen chamber 14 mentioned above, in connection with the present embodiment, means the positioning of the bottom plate 18 whose circumferential margin is engaged by one end of the hangers 30. The other end of the hangers 30 is adjustably attached, by screws 31 and springs 32, which may be plate springs, for example, to a cover plate 33, which is shown separately in FIGS. 9a and b, with additional parts which will be discussed later. The hangers 30 are also shown in FIGS. 7, 8a and 9b. Additional representations of the dependent struts 25 are contained in FIGS. 7, 8b, 11a and 11b.

The dependent struts 25 and hanger struts 30 have the smallest possible cross section so as to further reduce thermal conduction. Making the dependent struts 25 and hanger struts 30 of strips of sheet metal results in a very narrow gap between heat shields 34, which surround the space around the substrate as completely as possible. In this manner, good thermal insulation of the hot zone within the heat shields 34 is achieved, where, as in the state of the art, an oven 2 is built around the substrate 4, as well as less heating of the vapor depositing apparatus, in comparison with a condition in which there are large gaps between the individual heat shields 34.

The revolving arms 23 in the present embodiment consist of plates with rectangular cut-outs, i.e., they have the shape of an empty rectangle. The sides of this rectangle have the smallest possible cross section, which also contributes to the reduction of the thermal conduction of the rotary mounting 22. Between the dependent struts 25 and the revolving arms 23, there can also be spacers 35 of especially low thermal conductivity. Examples of the latter are washers, ceramic parts, etc.

The rotary mounting 22 turns by means of the revolving arms 23 through ball bearings 36 on a water-cooled, fixed shaft 37. Due to the short distance between the substrate holder 15 and the cooled ball bearings 36, two of which are present in the illustrated example, a high stability is achieved. The ball bearings 36 are held against one another without free play.

The resistance to thermal conduction between the revolving arms 23 of the carousel or rotary mounting 22, which are in direct contact with the ball bearings 36, and that of the suspension of the substrate holder 15, can be increased by the above-mentioned spacers 35 (e.g., by ceramic components) in order to reduce heating the ball bearings through the revolving arms.

The oxygen chamber or pocket 14 is adjusted by the screws 31 in the hangers 30. The screws 31 are, as stated above, countered by the plate springs 32 or other resilient means. Through this adjustment, the oxygen chamber 14 can be made precisely level with respect to the axis or plane defined by the ball bearings 36, and secondly the gap between the oxygen chamber 14 and the substrate holder 15 can be optimized.

At the lower end of the shaft 37 is a heat shield 34 which contains a cooling body 38 which is made in one piece with the shaft 37 of a material of good thermal conductivity. Thus the cooling body 38 is also cooled by the cooling water of shaft 37. The cooling body 38 of the heat shield 34, together with a stack of sheets 39 also belonging to the latter, protects the ball bearings 36 against heat radiated by heating devices 40 which form the heating oven 2 described in the state of the art. The heat shield 34 provides for a shielding of the ball bearings 36 and the water-cooled fixed shaft 37 against heat.

Figure 10A:
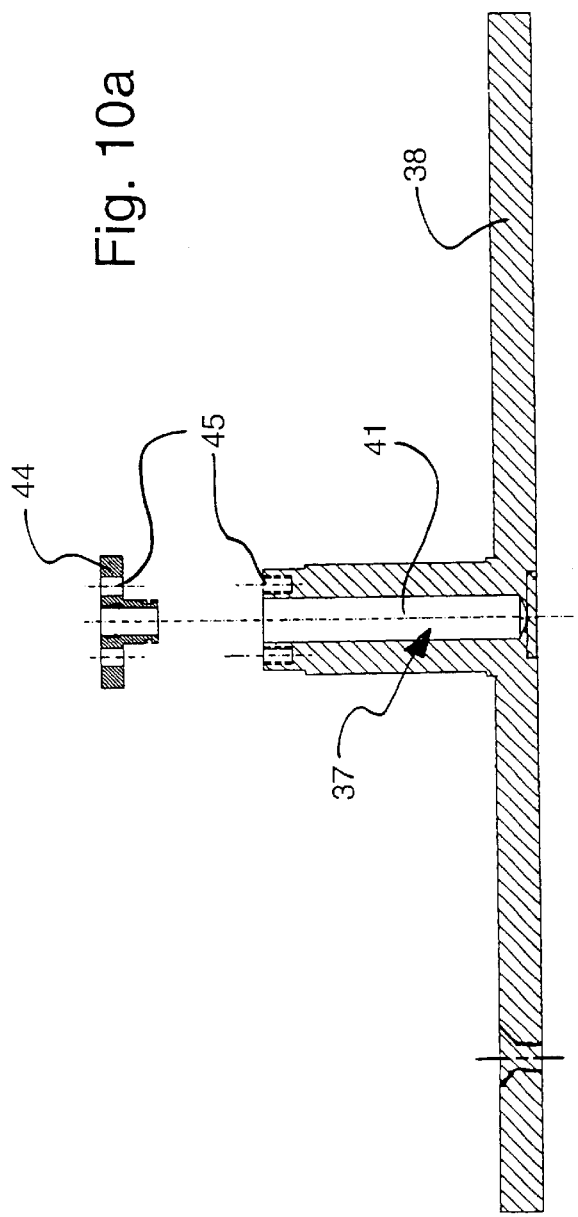
FIGS. 10a–10b are a cross-sectional view and a partial plan view of the shaft and the cooling bodies of the heat shield of the embodiment shown in FIG. 5 of the apparatus for producing thin oxide coatings.
Figure 10B:
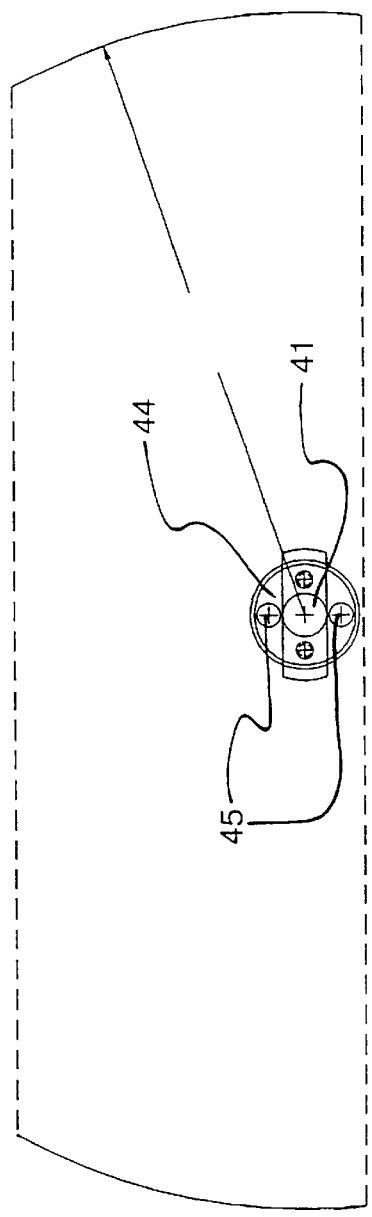
Figure 10C:
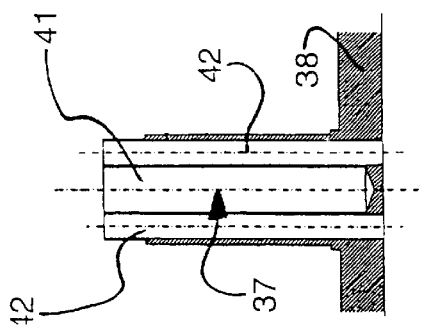
FIG. 10c shows in a schematic fragmentary view additional details of the shaft and of the cooling body of the heat shield of the embodiment shown in FIG. 5 of the apparatus for producing thin oxide coatings.

Details of the fixed shaft 37 and the cooling body 38 are shown in FIGS. 10a–c, where the cooling water passage 41 and two lead-throughs 42 for wires 43 (see FIG. 1) running to the heating systems 40 can be seen. The hollow shaft 37 is closed by a cover 44 which can be fastened to the hollow shaft 37 by screws (not shown) through taps 45 provided for them. The configuration of the cooling water passage 41 can have various forms and courses other than the version shown. Especially, a plurality of cooling water passages 41 can be contained in the shaft 37 and also in the cooling body 38, or can also be mounted externally thereon.

The heat shield 34 at the shaft 37 is in the cylindrical space that is defined by the revolving arms 23, the dependent struts 25 and the substrate holder 15. At the bottom of this heat shield 34, i.e., against the substrate holder 15, a top heater 46 is provided as a component of the heating systems 40. This contains a heating plate 47 on which heater wires 48 are arrayed as closely together as possible. This results in a large heat radiating surface and thus, for a given radiating power, a very low temperature in the heater wires 48. This leads to a lesser evaporation of impurities, i.e., to better quality in the thin coatings. Moreover, the lower temperature of the heater wires 48 gives them a longer life.

As it can be seen especially well in FIG. 1, the heating systems 40 furthermore contain a circumferential heater 49 which surrounds the rotary mounting in the area of the substrate holder 15 and outside of the hangers 30, but is disposed inside of the corresponding heat shield 34 described in connection with the gap between the hangers 30 and the dependent struts 25, which circumferentially terminates the hot zone formed by the heating systems 40. Also underneath the substrate holder 15 there is a bottom heater 50 which covers the entire area of the bottom plate 18, with the exception of the mask 19. The area covered by the bottom heater 50 is shielded from the rest of the space, again by means of a heat shield 34. Also, the circumferential heater 49 and the bottom heater 50 contain heating plates 47 on which heater wires 48 are arranged as closely together as possible, for the same reasons and with the same advantages as in the case of the top heater 46.

The heaters 46, 49 and 50 surround the substrate holder 15 on all sides in order to approximate a cavity radiant heater. To this end, there is provided, in the area of the mask 19, a flue 51 which defines the path of the material evaporated from the crucibles 9 to the substrate 4. The flue 51 is provided on its outer side, i.e., the side racing away from the metal vapor path, with a flue heater 52, which again contains the closely laid jacket heater wires 48. Thus, a very uniform temperature on the entire surface of the substrate 4 can be assured.

The jacket heater wires 48 are fastened without hard soldering to the heater plates 47 or possibly directly on the outside of the flue 51 by binding them with a thin stainless steel wire. This type of bonding avoids any impurities evaporating from a solder, leads to fewer mechanical stresses during heating and cooling, and thus leads to a longer useful life of the heater elements. The supply of power to the components of the heater system 40 is facilitated by the fact that the leads 43 are carried in the shaft 37 for the ball bearings 38. The lead wires 43 are contained in bores or lead-throughs 42 in shaft 37 beside the passage or passages 41 of the water cooling system.

The substrate holder 15 is adjusted by adjusters 53 which are associated with the revolving arms 23. In the embodiment shown (see FIGS. 1, 7, 11a and especially 11c), each adjuster 53 is formed by two threaded bolts 54 and a threaded sleeve 55. The two bolts 54 are held together by the sleeve 55 with an internal screw thread. The bolts 54 and the sleeve 55 have right-hand and left-hand or differential threading with different throw. Adjustment of the sleeve 55 thus produces a contraction or elongation of the system and thus a resilient deformation of the arm 23 in the form of a parallelogram. This results in a raising or lowering of the dependent struts 25. The substrate holder 15 can thus be made precisely level with respect to the axis or plane defined by the ball bearings 36. Due to this adjustment, the gap width between the oxygen chamber 14 and the substrate holder 15 can be optimized.

On the one hand, to facilitate the deformation of the revolving arms 23, and on the other hand to achieve the lowest possible thermal conduction, the revolving arms 23 have indentations 56 near their corners.

A motor 57 for driving the turntable or substrate holder 15 through the ball-bearing rotary mounting 22 is located within the vapor depositing apparatus, i.e., inside of the vacuum chamber 1 and provided with a water-cooled sleeve (not visible in the schematic drawing).

Thus, a shaft entrance bearing, which has as a rule but a short life, is avoided. In addition to cooling the motor 57 with a water-cooled sleeve, the corresponding heat shields 34 contribute toward the avoidance of overheating the motor 57.

Also, by the elimination of the shaft entrance bearing through a wall of the vacuum chamber 1, which can be a box coater, for example, the turntable or substrate holder 15 and the motor 57 can easily be removed as a compact unit, which facilitates servicing and adjustment. While not shown separately in the drawing, it is easily understood by one skilled in the art that, if such components are installed so as to be removable on drawer slides from the entire apparatus or from the vacuum chamber 1, their service will be even easier.

The transfer of power between the motor 57 and the ball-bearing rotary mounting 22, and thus also the substrate holder 15, occurs by way of a transmission 58 of metal, such as a coil spring 59 with pulleys 60, for example, or a chain with sprockets or a gear drive. Thus, there is no danger of thermal destruction of the transmission 58. A metallic transmission 58, with a metal coil spring 59 for example, running over belt pulleys 60, will not be damaged—by burning for example—by the heat issuing from the heaters 40, resulting in contamination of the film material.

Materials which are used in the hot zone, i.e., within the heaters 46, 49 and 50 as well as 52 if provided, are stainless steel or special high-temperature steel (INCONEL, for example). Alternatively, some or all parts of the apparatus can be made of ceramic. Thus, better dimensional accuracy and a still narrower gap width between the substrate holder 15 and the oxygen chamber 14 can be achieved, as can stability of shape at high temperatures and tighter tolerances. This in turn results in a reduced flow of oxygen, a lower pumping power and the possibility of using still larger substrate holders 15.

On account of the simplicity of its purpose, the arrangement of the crucibles 9 underneath the turntable or substrate holder 15 in the area of the mask 19 is not shown separately. This is because the arrangement of the crucibles 9 is such in the present embodiment that their center points form a circle whose radius is at least approximately half as great as that of the substrate holder 15 or carrier plate 20. The center point of the circle is situated vertically underneath the center of the substrate holder 15. More accurately, the diameter of the arc of the crucibles 9 in the present embodiment is, as nearly as possible, one-half as great as the radius on which the mask 19 is based. In this manner, concentration gradients of the thin coatings containing several metal components are avoided.

To be able to make in-situ buffer coatings and cover coatings, which are important for microwave filters, for example, an electron beam gun is mounted movably in the vapor depositing apparatus, so that it can be moved over the crucibles 9. Again, there is no need to show this in the drawings since it is a simple matter for the man of the art.

The stability of the gap seal in the present embodiment, which has already been tested in practice, makes it possible to have gaps between the substrate holder 15 and the oxygen chamber 14 of less than 0.3 mm, and hence pressure gradients of 1000:1, with a very economical pumping power, even with a substrate holder 15 of large diameter.

The combination of the adjustable suspension of the oxygen pocket or chamber 14 from the cold cover plate 33 with the adjustable revolving arms 23, which contain adjusters 53 described above, and which contain indentations formed in the corners of the rectangular shape of the revolving arms 23, makes possible an especially good, simple and optimum establishment of the gap width between the substrate holder 15 and the oxygen chamber 14. Due to this adjustability, an adjustment of the center of rotation and of the parallelism of the substrate holder 15 with the oxygen chamber is made possible. The settings remain largely stable even during temperature variations if the suspension of the oxygen pocket 14 and substrate holder 15 is provided by material of the same thermal expansion. Thus, any adjustment of the gap width is at least largely avoided.

The heating of the substrate or substrates 4 is performed by fixed heaters 46, 49 and 50, as well as 52 in some cases, i.e., underneath the cold cover plate 33 additionally shielded from the latter by radiation or heat shields 34, heater wires around the oxygen chamber and a circumferential heater above the circumferential margin of the substrate holder 15, resulting in a virtually closed oven geometry and a uniform temperature over the entire surface to be coated. Radiation losses in any case can occur only through the vapor depositing zone, and there they are minimized by the flue heating. The shielding plates or heat shields 34 reduce heat losses from the hot zone, so that the power absorbed by the heating systems 40 can be restricted to a minimum.

The heating filament (THERMOCOAX) is in this system fixed in place by a metal wire and not hard-soldered, since the solder would in the long run contaminate the film material by its degradation and vaporization.

Additional details of the embodiment of the apparatus for producing thin oxide coatings discussed above can be seen in the other figures of the drawing.

FIGS. 5, 6, 7, 9a and 9b show various views of other details of the various components. In particular it can be seen from these drawings how the motor 57 is fastened to the cover plate 33 by intermediate plates 61 and 62.

FIGS. 8a, 8b, 8c, 11a and 11b provide further information on the forms of arm 23 (in cross section), the dependent struts 25 and hanger struts 30 as well as their variant attachments to one another and to the shaft 37.

Figure 13A:
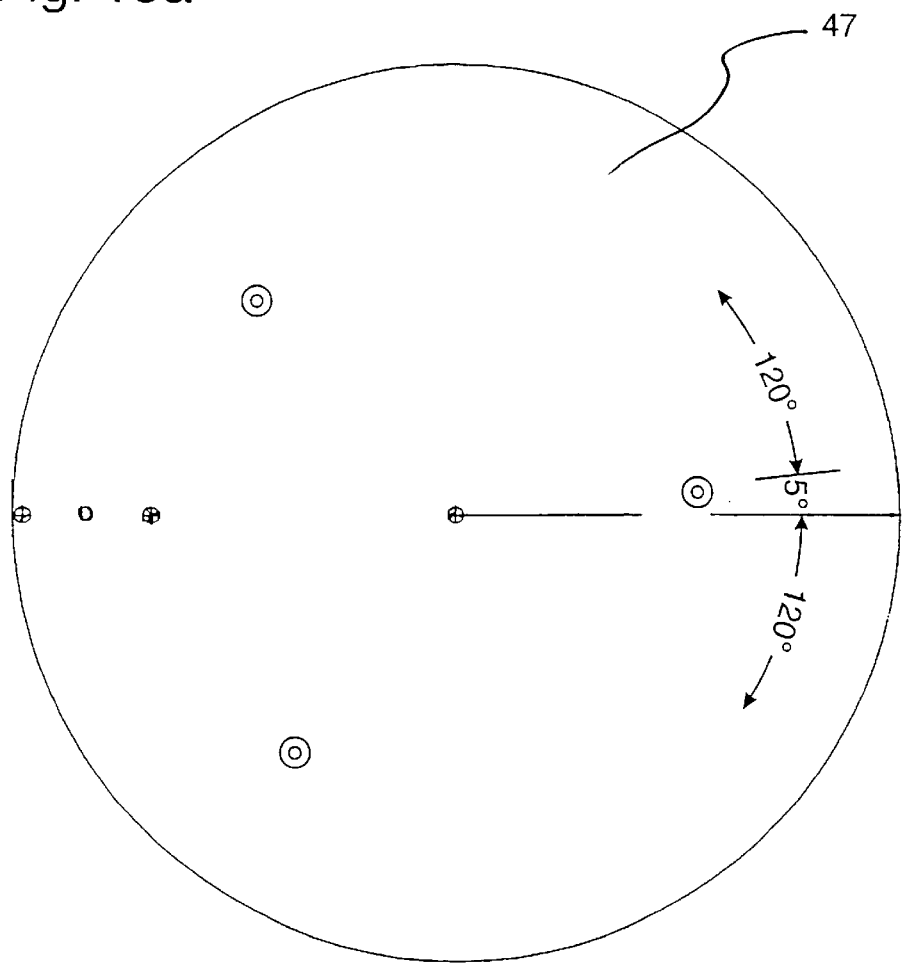
FIGS. 13a–13b is a plan view and a sectional view through a heater plate of the embodiment shown in FIG. 5 of the apparatus for producing thin oxide coatings.
Figure 13B:
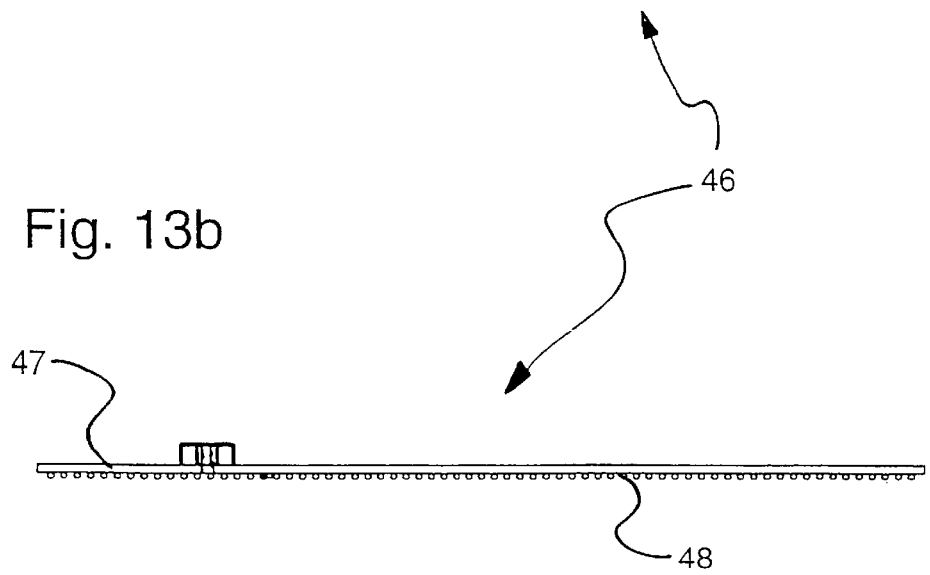

In FIGS. 13a and b, the heating plate 47 of the topside heater 46 is represented. As in FIG. 10a and taken together with FIGS. 13a and b, it can be understood how this heating plate 47 is fastened to the shaft 37 by screws (not shown) together with the cooling body 38 of the corresponding heat shield 34, through the bores shown in the figures. This method of fastening the heating plate 47 to the cooled body 38 provides for a minimum of thermal transfer from the heating plate 47 to the cooling body 38.

The present invention is not limited to the description given in connection with concrete embodiments, which is provided only as an example.

In particular, it is important in the scope of the invention that, in an apparatus for the production of thin oxide coatings, with a vacuum chamber in which an oxygen chamber with an opening and a rotating substrate holder overlapping the latter are disposed, a rotary mounting is provided for the rotatory arrangement of the substrate holder, which engages a circumferential part of the substrate holder. In this case, various possibilities can be provided for the adjustment of the rotary mounting, substrate holder and oxygen chamber and its opening, without departing from the invention. The invention furthermore is not limited to the type of construction of the substrate holder which is shown in the figures and described. Other forms, capacities and mechanisms can be used, for example, for turning the substrates. The arrangements and configurations of heat shields and heaters are not given conclusively and therefore are not to be understood as limiting.

The arrangement of the motor within the vacuum chamber, alone and in conjunction with a metallic transmission results in independent advantages and is therefore also to be considered as independent of the binding of the substrate holder by the rotary mounting. This also applies to the arrangement of the at least one vapor depositing apparatus, the configuration of the segmental cut-out mask, the design of the shaft for the rotary mounting, especially in connection with the cooling body and the flue, preferably including the flue heater.

The features given in the description of the state of the art, and already disclosed therein, are also features of the present invention in so far as they are not contrary to the configurations of the invention or recognizably cannot be substituted in the scope of the invention.

The full scope of the invention is intended, by the claims and by the entire content disclosed by the present description, as it reveals itself to the man of the art, for concrete variations of embodiment, without limitation.

What is claimed is:

1. Apparatus for the production of thin oxide coatings comprising:
    a vacuum chamber,
    an oxygen chamber in said vacuum chamber and having an opening,
    a rotary substrate holder, adapted to sequentially allow a substrate to have access to a coating material and oxygen chamber overlap, sealing said opening of said oxygen chamber, and
    a rotary mounting provided for the rotary arrangement of the substrate holder which engages a circumferential portion of the substrate holder.

2. Apparatus for the production of thin oxide coatings according to claim 1, wherein the rotary mounting permits an adjustment of the tilt of the substrate holder with respect to, and/or of the distance of the substrate holder from, the opening of the oxygen chamber.

3. Apparatus for the production of thin oxide coatings according to claim 1, wherein the rotary mounting contains at least three individual, spaced-apart revolving arms and dependent struts associated with the revolving arms, which engage the circumferential portion of the substrate holder and connect the revolving arms to the substrate holder, the revolving arms are of rectangular or parallelogram-like shape, and the revolving arms are connected to the dependent struts by spacers, made of, for example, ceramic components, having an elevated thermal transfer resistance.

4. Apparatus for the production of thin oxide coatings according to claim 3, wherein at least one of the revolving arms is adjustable to set the distance of the substrate holder from the opening of the oxygen chamber, and wherein, for adjustment of the at least one of the revolving arms, an adjuster is provided for resilient deformation of the rectangular or parallelogram-like shape.

5. Apparatus for the production of thin oxide coatings according to claim 3, wherein the oxygen chamber is positioned through adjustable hangers which are at least largely parallel to the dependent struts of the rotary mounting and lie on a slightly larger circle, and wherein the dependent struts of the rotary mounting and the hangers of the oxygen chamber contain the same material or consist of the same material and/or have the same or similar cross sections.

6. Apparatus for the production of thin oxide coatings according to claim 1, wherein the substrate holder contains a ring into which at least one carrier plate can be laid, which is designed to hold at least one substrate.

7. Apparatus for the production of thin oxide coatings according to claim 1, wherein the rotary mounting is rotatably mounted on a fixed shaft, the fixed shaft is cooled, and the support of the rotary mounting of the substrate holder lies close to the latter.

8. Apparatus for the production of thin oxide coatings according to claim 7, wherein a heat shield is disposed on the fixed shaft between the bearing on the rotary mounting of the substrate holder and the substrate holder and is made integral with the fixed shaft, and/or that the fixed shaft and the heat shield at least substantially consist of a material of good thermal conductivity.

9. Apparatus for the production of thin oxide coatings according to claim 8, wherein the heat shield contains a cooling body connected to the cooling of the fixed shaft, and/or a plurality of lamellar or leaf-like radiation shields, the latter lying between the cooling body and the substrate holder.

10. Apparatus for the production of thin oxide coatings according to claim 8, wherein, between the heat shield and the substrate holder, a top-side heater is provided, which is powered through the fixed shaft.

11. Apparatus for the production of thin oxide coatings according to claim 1, wherein a peripheral heater is provided around the circumference of the substrate holder, and/or that the oxygen chamber is heated by way of a bottom heater disposed on the side facing away from the substrate holder.

12. Apparatus for the production of thin oxide coatings according to claim 1, wherein a vapor depositing zone is formed in the area of the substrate holder outside of the oxygen chamber, and is defined by a vapor depositing flue directed at the substrate holder, and wherein a flue heater for heating the vapor depositing flue is provided, and/or that a bottom heater is disposed for the substrate holder on its side facing the vapor depositing flue in its area lying outside of the vapor depositing flue.

13. Apparatus for the production of thin oxide coatings according to claim 11, wherein the peripheral heater and/or the bottom heater are thermally shielded on their sides facing away from the substrate holder.

14. Apparatus for the production of thin oxide coatings according to claim 10, wherein the top-side heater contains closely placed jacket heater wires which are attached, by unsoldered mechanical bindings, to heater wire holders.

15. Apparatus for the production of thin oxide coatings according to claim 1, wherein, in the area of the substrate holder outside of the oxygen chamber, a vapor depositing zone is formed in the shape of a sector and is defined by a sector-shaped cutout mask whose center point lies on the axis of the substrate holder and is drawn concavely within the vapor depositing zone along the radially running sector sides.

16. Apparatus for the production of thin oxide coatings according to claim 7, wherein, to drive the rotary mounting, a motor is disposed within the vacuum chamber and is drivingly coupled to the rotary mounting in the area of the journal of the rotary mounting on the fixed shaft, and wherein a metal transmission, which contains a coil spring and belt pulleys, a chain with sprockets and/or a gear drive for the coupling of the motor and the rotary mounting, is provided.

17. Apparatus for the production of thin oxide coatings according to claim 1, wherein the vacuum chamber includes drawer slides disposed therein on which individual assemblies lying inside the vacuum chamber of the apparatus can be drawn entirely or partially out of the vacuum chamber.

18. Apparatus for the production of thin oxide coatings according to claim 1, wherein individual components in heated zones of the apparatus consist wholly or partially of stainless steel, high-temperature steel and/or ceramic, and/or wherein the rotary mounting and/or the substrate holder consist wholly or partially of a material of low thermal conductivity and/or thermal expansion.

19. Apparatus for the production of thin oxide coatings according to claim 12, wherein at least one vapor depositing crucible, which lies outside of the oxygen chamber and is associated with the vapor depositing flue, is provided and is disposed on a circle whose radius measures one-half of the radius of a segmental cutout mask and whose center point is aligned with the axis of the substrate holder, and wherein vapor depositing devices or vapor depositing crucibles, which are arranged closely together on the circle, are provided.

20. Apparatus for the production of thin oxide coatings according to claim 1, wherein a plurality of vapor depositing crucibles and an electron beam gun movable relatively thereto are provided.

21. Apparatus for the production of thin oxide coatings according to claim 1, wherein the distance of the substrate holder from the opening of the oxygen chamber is adjustable such that when the apparatus is in operation it amounts to less than 0.3 mm.

22. Apparatus for the production of thin oxide coatings according to claim 12, wherein the flue heater is shielded thermally on its side facing away from the vapor depositing flue.

23. Apparatus for the production of thin oxide coatings according to claim 11, wherein the peripheral heater and/or the bottom heater contains closely placed jacket heater wires which are attached by unsoldered mechanical bindings to heater wire holders.

24. Apparatus for the production of thin oxide coatings according to claim 12, wherein the flue heater and/or the bottom heater contains closely placed jacket heater wires which are attached by unsoldered mechanical bindings to heater wire holders.

25. Apparatus for the production of thin oxide coatings according to claim 13, wherein the peripheral heater and/or the bottom heater contains closely placed jacket heater wires which are attached by unsoldered mechanical bindings to heater wire holders.

* * * * *